United States Patent [19]

Gregorian et al.

[11] Patent Number: 4,555,668
[45] Date of Patent: Nov. 26, 1985

[54] GAIN AMPLIFIER

[75] Inventors: Roubik Gregorian; Bahram Fotouhi, both of San Jose, Calif.

[73] Assignee: American Microsystems, Inc., Santa Clara, Calif.

[21] Appl. No.: 542,228

[22] Filed: Oct. 14, 1983

[51] Int. Cl.[4] ............................................. H03F 1/02
[52] U.S. Cl. ........................................ 330/9; 330/51; 330/107
[58] Field of Search ............................ 330/9, 51, 107; 333/173; 307/520

[56] References Cited

U.S. PATENT DOCUMENTS

| 4,422,155 | 12/1983 | Amir et al. ........................... 364/606 |
| 4,438,354 | 3/1984 | Haque et al. ......................... 307/493 |
| 4,441,082 | 4/1984 | Haque ................................. 330/129 |
| 4,450,368 | 5/1984 | Spence ................................ 307/362 |
| 4,470,126 | 9/1984 | Haque ................................. 364/825 |

OTHER PUBLICATIONS

U.S. patent application Ser. No. 06/381,807, filed 5/25/82 for Gideon Amir and Roubik Gregorian entitled "Multiplier/Adder Circuit".

Primary Examiner—James B. Mullins
Attorney, Agent, or Firm—Steven F. Caserza; Alan H. MacPherson; Kenneth E. Leeds

[57] ABSTRACT

A novel switched capacitor gain stage uses a unique circuit design and clocking technique that reduces the component mismatch offset voltage and the clock-induced feedthrough offset voltage produced by the circuit. The total capacitance ratio between the input capacitors and the feedback capacitor necessary to achieve a desired total gain is also minimized.

10 Claims, 4 Drawing Figures

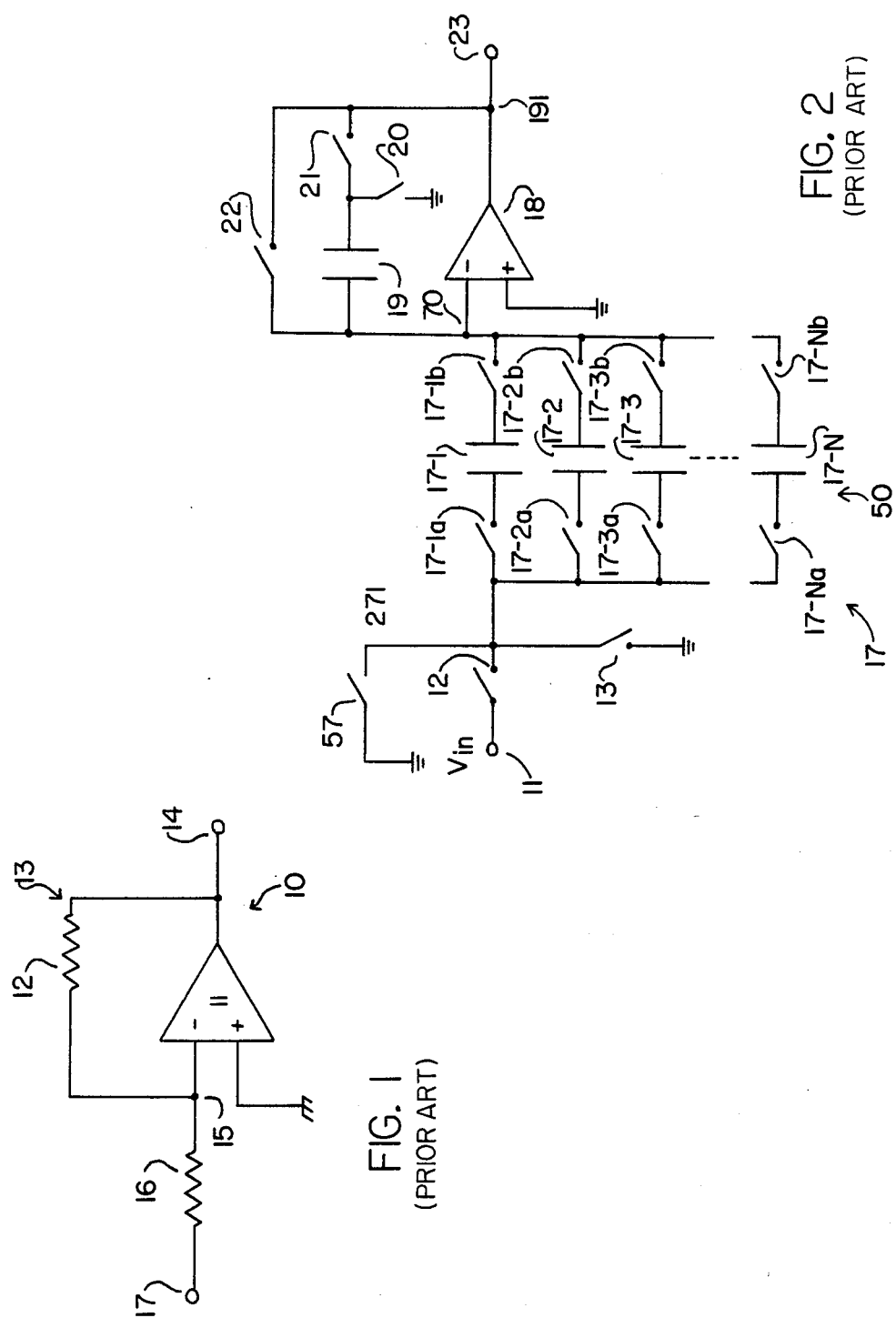

GAIN AMPLIFIER

BACKGROUND OF THE INVENTION

1. Field of the Invention

This invention relates to gain stages and, more specifically, to a programmable switched-capacitor operational amplifier gain stage.

2. Description of the Prior Art

Gain stages are well known in the prior art. A gain stage produces an amplified output signal, which can be many times greater than the input signal. In general, the amplification, or gain, depends upon the ratio of the passive elements in the gain stage. Typically, resistors are used as the passive elements.

One common type of prior art gain stage is the operational amplifier gain stage. As shown in FIG. 1, this particular type of gain stage 10 includes an operational amplifier 11, a first passive element 12 located in the feedback loop 13, which provides a connection between the output lead 14 and the inverting input lead 15 of the operational amplifier, and a second passive element 16 located between the input terminal 17 and the inverting input lead 15. The gain of this operational amplifier gain stage is equal to the negative of the ratio of the resistance of the feedback resistor 12 to the resistance resistor 16:

$$G_{10} = -R_{12}/R_{16} \qquad (1)$$

where
- $G_{10}$ is the gain of gain stage 10;
- $R_{12}$ is the resistance of resistor 12; and
- $R_{16}$ is the resistance of the resistor 16.

Unfortunately, offset voltages cause these prior art operational amplifier gain stages to provide a range of output signals less than that theoretically available from ideal operational amplifier gain stages. An offset voltage is a voltage that appears when the noninverting input lead of an operational amplifier is connected to ground and the inverting input lead is connected to the output lead of the operational amplifier. Theoretically, these offset voltages should not be produced, but because of inevitable component mismatches during fabrication, all operational amplifiers produce offset voltages—even when there is no voltage applied to the amplifiers. The value of the offset voltage cannot be determined before the fabrication of the amplifier. Furthermore, the offset voltage varies between devices and with time and temperature.

Offset voltages are undesirable. They limit the dynamic range of output signals provided by the operational amplifier. As is well known, operational amplifiers have an active region in which the output signal is proportional to the input signal. Beyond this active region, the operational amplifiers are saturated, that is, they produce the same output signal regardless of the input signal. Offset voltages effectively diminish the active region since they are a part of the input signal. As a result, the dynamic range of output signals provided by the operational amplifier is less than that theoretically available from ideal amplifiers.

Switched capacitors have been used as the passive elements in operational amplifier gain stages, for example, by Hosticka et al., "MOS Sampled Data Recursive Filters Using Switched Capacitor Integrators", *IEEE Journal of Solid-State Circuits*, Vol. SC-12, No. 6, pages 600-608, December 1977, which is hereby incorporated by reference.

One problem associated with the use of a switched capacitor in the feedback loop is the generation of another form of offset voltage. Whenever MOS switches are turned off or on, a clock feedthrough voltage appears at the output of the operational amplifiers. This clock-induced feedthrough voltage appears as a result of inevitable gate-to-drain or gate-to-source capacitance mismatches. Ultimately, this feedthrough voltage manifests itself as an offset voltage.

Either increasing the value of the feedback capacitor or reducing the size of the resetting MOS switch reduces the clock-induced feedthrough offset voltage. However, both of these methods are unsatisfactory. Both methods increase the RC time constant of the circuit. As a result, the settling time of the operational amplifier is restricted. In addition, the first method requires a large silicon area. If the voltage gain is to be 48 dB and the feedback capacitance 10 pF, the input capacitance would have to be 2512 pF—much too large for use in practical integrated circuits.

Other prior art operational amplifier gain stages provide a programmable gain. Such prior art operational amplifier programmable gain stages are disclosed, for example, in U.S. patent application, Ser. No. 249,775 (now U.S. Pat. No. 4,422,155) on an invention of Amir; U.S. patent application, Ser. No. 292,870 (now U.S. Pat. No. 4,438,354), on an invention of Haque, et al.; U.S. patent application, Ser. No. 310,160 (now U.S. Pat. No. 4,441,082), on an invention of Haque; U.S. patent application, Ser. No. 316,183 (now U.S. Pat. No. 4,470,126), on an invention of Haque; and U.S. patent application, Ser. No. 381,807, filed May 25, 1982, on an invention of Amir, et al., each of which is assigned to American Microsystems, Inc., the assignee of the present invention, and each of which are hereby incorporated by reference.

FIG. 2 depicts one such operational amplifier programmable gain stage utilizing switches capacitors as the passive elements. Programmable operational amplifier gain stage 100 of FIG. 2 provides an array 17 of N capacitors 17-1 through 17-N; each of the capacitors 17-1 through 17-N being switchably connected via a pair of switches 17-1a, 17-1b through 17-Na, and 17-Nb between the inverting input lead 70 of operational amplifier 18 and the input terminal 11 of gain stage 100. Selected ones of the N capacitors 17-1 through 17-N are connected between the inverting input lead 70 of operational amplifier 18 and input terminal 11 in order to select the effective capacitance of the capacitor array 17. As a result, the desired gain of gain stage 100 is selected as follows:

$$G_{100} = -C_{17}/C_{19}, \qquad (2)$$

where
- $G_{100}$ is the gain of programmable gain stage 100;
- $C_{17}$ is the effective capacitance of capacitor array 17; and
- $C_{19}$ is the capacitance of feedback capacitor 19.

U.S. patent application, Ser. No. 292,870 on an invention of Haque, et al., entitled "Monolithic Programmable Gain—Integrator Stage" (now U.S. Pat. No. 4,438,354) which is assigned to American Microsystems, Inc, the assignee of this invention, and which is hereby incorporated by reference, describes a circuit that eliminates the effects of the offset voltages produced by the gain stages. The Haque circuit includes an integrator stage, which first integrates the positive of the offset voltages produced by the gain stages and then integrates the negative of the offset voltages. The result is an integrated output voltage that is free of the effects of the offset voltages from the gain stages. The problem with this device is that it relies on an integrator stage to eliminate the offset voltages.

SUMMARY

This invention provides a novel switched capacitor gain stage using a unique circuit design and clocking technique that reduces the component mismatch offset voltage and the clock-induced feedthrough offset voltage produced by the circuit. In addition, this invention also minimizes the total capacitance ratio between the input capacitors and the feedback capacitors necessary to achieve a desired total gain. One embodiment of this invention is comprised of two AC coupled gain stages. The reduction in offset voltages is achieved by delaying the phase of the clock in the second stage. As a result, the clock feedthrough voltage is stored on an interstage capacitor array, and subsequently is removed as an offset error.

The two stages also reduce the total capacitance ratio between the input capacitors and the feedback capacitor necessary to achieve a desired total gain. The total gain from the two stages could be achieved by only one stage, but the single gain stage would have to include a much larger capacitance.

BRIEF DESCRIPTION OF THE DRAWINGS

FIG. 1 is a schematic diagram of a prior art operational amplifier gain stage using resistive elements to control the gain;

FIG. 2 is a schematic diagram of a prior art operational amplifier gain stage using switched capacitors to control the gain;

DETAILED DESCRIPTION

Figure 3:
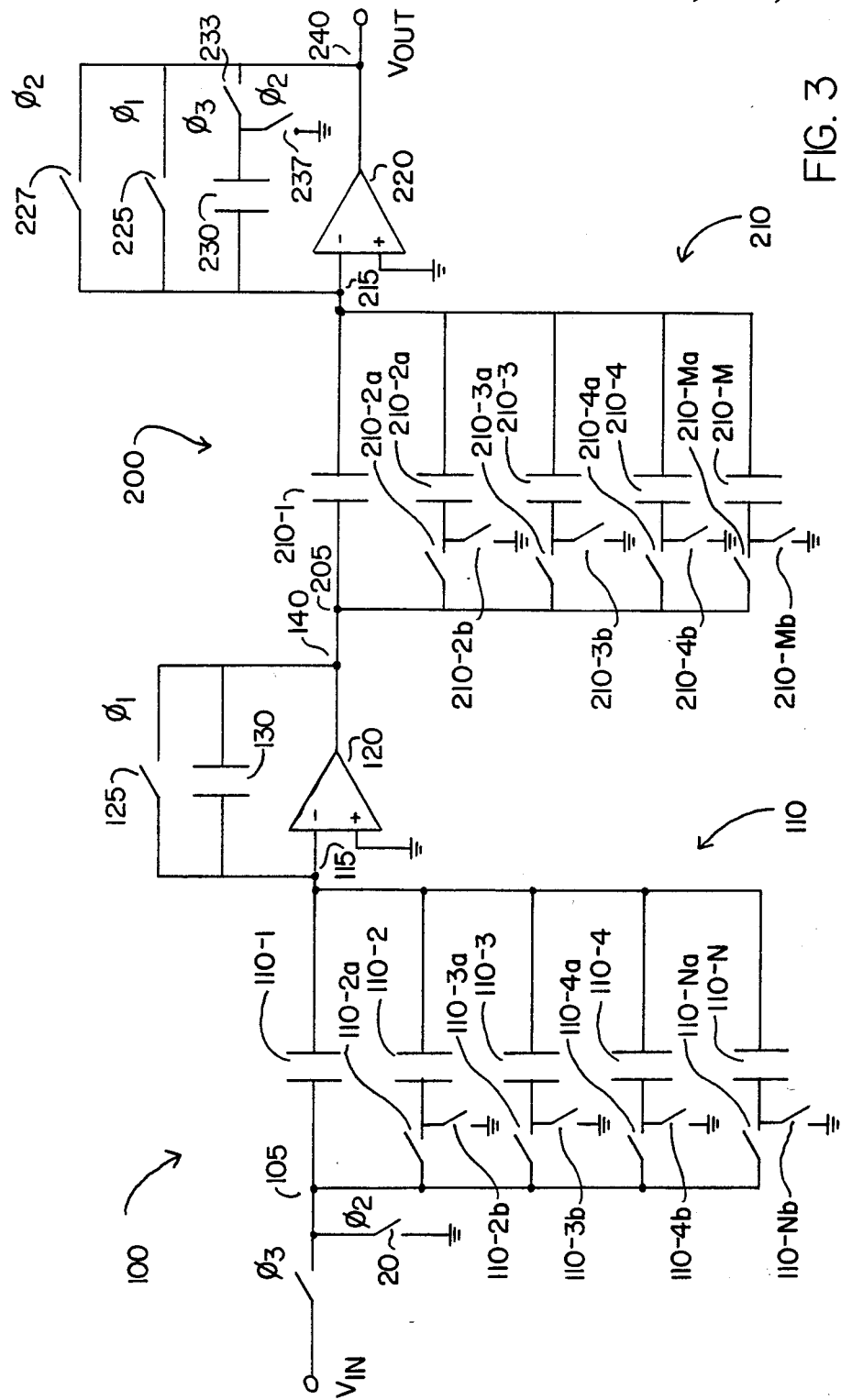
FIG. 3 is a schematic diagram of one embodiment of the present invention utilizing switched capacitors in order to control the gain of a two-stage gain circuit.
Figure 4:
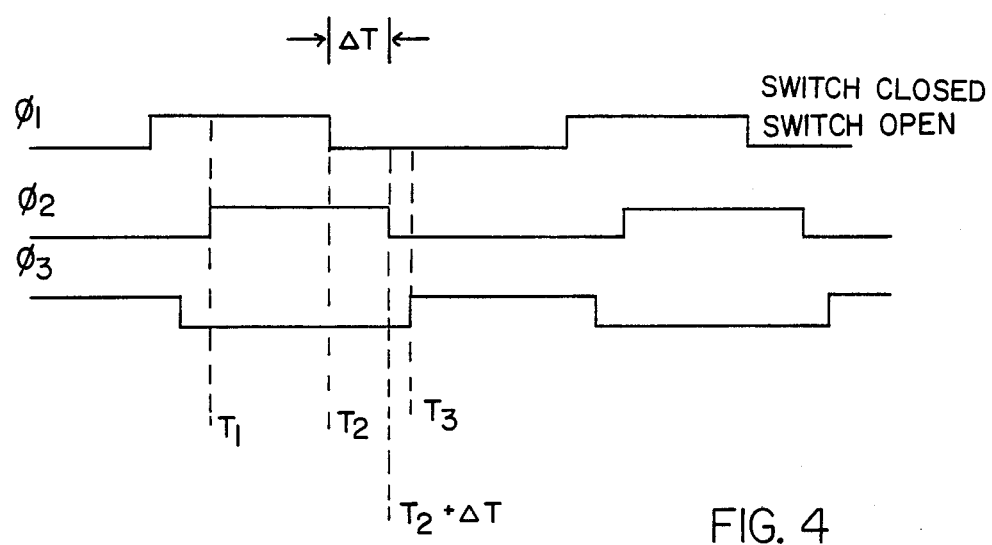
FIG. 4 is a diagram depicting the relationships between the timing signals used to control the embodiment of the invention depicted in FIG. 3.

FIG. 3 shows one embodiment of our invention. Two gain stages, 100, 200, are utilized. Both stages contain an array of capacitors, 110, 210 with N and M capacitors, respectively, in each array; an operational amplifier 120, 220; a capacitor in the feedback loop, 130, 230; and a plurality of switches controlled by clock signals $\phi_1$, $\phi_2$, $\phi_3$. The timing relationships between the clock signals $\phi_1$, $\phi_2$ and $\phi_3$ are shown in FIG. 4.

One significant difference between stage 100 and stage 210 is that the latter includes a second feedback loop including switch 227. This second feedback loop connects the output lead 240 to the inverting input lead 215 of operational amplifier 220 when $\phi_2$ is high. As will be described more fully later, this second feedback loop 227 enables the circuit to reduce the effect of the overlap capacitance of the second stage feedback switch 225, which, in turn, reduces the clock-induced feedthrough offset voltage.

The operation of the circuit of FIG. 3 is as follows. At time $t_1$, the gains of gain stages 100 and 200 are selected. A first and second binary word is provided to control the MOS switches 110-2a through 110-Na (and thus switches 110-2b throught 110-Nb) and 210-2a through 210-Ma (and thus switches 210-2b through 210-Mb) of capacitor arrays 110 and 210, respectively. Thus, selected ones of the capacitors 110-1 through 110-N and 210-1 through 210-M are connected to the nodes 105 and 205, respectively. If desired, additional switch means can be used to selectively disconnect capacitors 110-1 and 210-1. As a result, each capacitor array 110, 210 has an effective capacitance, $C_{110}$, $C_{210}$, and the gain of each gain stage is given by:

$$G_{100} = -C_{110}/C_{130};\ G_{200} = -C_{210}/C_{230} \quad (3)$$

where $G_{100}$ = the gain of gain stage 100;
$C_{100}$ = the effective capacitance of capacitor array 110;
$C_{130}$ = capacitance of feedback capacitor 130;
$G_{200}$ = the gain of gain stage 200;
$C_{210}$ = the effective capacitance of capacitor array 210;
$C_{230}$ = capacitance of feedback capacitor 230.

The gain of gain stage 100 is preferably significantly (typically on the order of 36 dB) greater than the gain of gain stage 200. Larger gains require that the ratio of the input capacitance (e.g., $C_{110}$, $C_{210}$) to feedback capacitance (e.g., $C_{130}$, $C_{230}$) be large. To minimize the total capacitance of any stage, feedback capacitance must be minimized. Reducing feedback capacitance, however, increases clock feedthrough offset voltage at the output of that stage. Since the clock feedthrough of the first stage is cancelled by delaying the clock of second stage with respect to the first stage, the feedback capacitance of the first stage can be made significantly smaller than that of the second stage. Therefore, it is advantageous to allocate most of the required gain to the first stage. In effect, gain stage 200 (which typically provides a gain on the order of 12 dB) is to "fine-tune" the coarse gain provided by gain stage 100.

During this same period $t_1$, the feedback capacitors $C_{130}$, $C_{230}$ are initialized. $\phi_1$ and $\phi_2$ are both high, thereby closing MOS switches 125, 225, 227, 237 and 20. As a result, the output lead 140, 240 of the operational amplifiers 120, 220, are connected to the inverting input leads 115, 215, respectively. This initialization causes each operational amplifier to produce an offset voltage, $V_{off100}$, $V_{off200}$. The offset voltages appear on both the output lead and the inverting input lead of each operational amplifier. Accordingly, the charge stored on capacitor array 210 at the end of time $t_1$, is given by:

$$Q_{210}(t_1) = C_{210}(V_{off100} - V_{off200}) \quad (4)$$

where $Q_{210}(t_1)$ = charge stored on capacitor array 210 of stage 200 at the end of time $t_1$;
$C_{210}$ = effective capacitance of capacitor array 210 of stage 200;
$V_{off100}$ = offset voltage produced by operational amplifier 120 when stage 100 is initialized; and
$V_{off200}$ = offset voltage produced by operational amplifier 220 when stage 200 is initialized.

At time $t_2$, $\phi_1$ goes low while $\phi_2$ remains high. $\phi_2$ subsequently goes low at time $t_2 + \Delta t$. During this time period, $\Delta t$, a clock-induced feedthrough offset voltage $V_{off100,f/t}$ appears on node 140, with a resultant small transient voltage also appearing on node 215. This transient voltage is absorbed by the operational amplifier 220, which is still being initialized by the closed switch 227, if the RC time constant of switch 227 and of the effective capacitances of capacitor arrays 110 and 210 is smaller than time delay $\Delta t$.

The charge at node 215 at the end of time $t_2$ is:

$$Q_{215}(t_2) = C_{210}[V_{off200} - (V_{off100} - V_{off100,f/t})] + C_{230}(V_{off200} - 0) \quad (5)$$

where $Q_{250}(t_2)$ = The charge stored on node 215 of stage 200 at the end of $t_2$;

$C_{210}$ = The effective capacitance of capacitor array 210 of stage 200;

$V_{off200}$ = The offset voltage produced by operational amplifier 220 when stage 200 is initialized;

$V_{off100}$ = The offset voltage produced by operational amplifier 120 when stage 100 is initialized; and $V_{off100,f/t}$ = The clock-induced feedthrough offset voltage produced by the opening of the switches.

At time $t_3$, $\phi_3$ goes high while $\phi_1$ and $\phi_2$ remain low. With $\phi_3$ high, the circuit amplifies the input voltage, $V_{in}$. The amplified voltage at node 140 is given by:

$$V_{140}(t_3) = -(C_{110}/C_{130})V_{in}(t_3) + (V_{off100} - V_{off100,f/t}) \quad (6)$$

$V_{140}(t_3)$ = The voltage on node 205 at time $t_3$;

$C_{110}$ = The effective capacitance of capacitor array 110;

$C_{130}$ = The capacitance of capacitor 130;

$V_{in}(t_3)$ = The input voltage at time $t_3$;

$V_{off100}$ = The offset voltage produced by operational amplifier 120 when gain stage 100 is initialized; and $V_{off100,f/t}$ = The clock induced feedthrough offset voltage.

This amplified voltage $V_{140}(t_3)$ is then fed into capacitor array 210. As a result, the charge at node 215 at time $t_3$ is given by:

$$Q_{215}(t_3) = C_{210}[V_{off200} - V_{140}(t_3)] + C_{230}[V_{off200} - V_{out}(t_3)] \quad (7)$$

Under Kirchoff's law, the charge at node 215 is conserved during times $t_2$ and $t_3$. Thus, the output voltage is found by equating equations (5) and (7) while using (6). The result is that $V_{out}$ is given by:

$$V_{out} = (C_{110}/C_{130})(C_{210}/C_{230})V_{in} + (C_{01}/C_{230})\Delta V_c \quad (8)$$

where $V_{out}$ = The output voltage available on node 250;
$C_{110}$ = The effective capacitance of array 110;
$C_{130}$ = The capacitance of capacitor 130;
$C_{210}$ = The effective capacitance of array 210;
$C_{230}$ = The capacitance of capacitor 230;
$V_{in}$ = The input voltage;
$C_{01}$ = The overlap capacitance of the feedback switches 225 and 227 in stage 200; and
$\Delta V_c$ = The peak to peak clock amplitude.

The second term of the above equation represents the clock induced feedthrough voltage from switch 227. This error is reduced if $C_{230}$ is increased and $C_{01}$ is decreased. Increasing $C_{230}$ increases the total circuit capacitance only slightly since the gain of stage 200 is preferably much less than the gain of stage 100. $C_{01}$ is decreased by utilizing two feedback switches 225, 227 in gain stage 200 with switch 225 being a large switch and switch 227 being a small switch. Thus, the clock induced feedthrough offset voltage is reduced so that the dynamic range of output signals provided by this circuit approaches that of an ideal operational amplifier gain stage.

This embodiment is merely illustrative of this invention and is not to be construed as limitations of this invention. Other embodiments of this invention will become apparent to those skilled in the art in light of the teachings of this invention. As but one example, additional gain stages can be cascaded, with each gain stage after the first including a second feedback initialization switch means 227 for minimizing the error components created by the previous stage, with a plurality of time periods being used as previously described. Alternatively, additional gain stages can be cascaded, with selected ones, or if desired only the last gain stage, including a second feedback initialization switch means 227 for eliminating the error components due to offset and switch errors.

I claim:

1. A gain amplifier comprising at least a first gain stage having a first gain factor and a second gain stage having a second gain factor, wherein each said gain stage comprises:

an input lead for receiving an input signal to be amplified;

an operational amplifier having an inverting input lead, a noninverting input lead connected to a reference voltage, and an output lead;

a feedback capacitor having a first plate connected to said inverting input lead and a second plate connected to said output lead of said operational amplifier;

input capacitor means connected between said input lead and said inverting input lead of said operational amplifier;

a first feedback initialization switch means connected between said inverting input lead and said output lead of said operational amplifier, and wherein said second gain stage further comprises:

a second feedback initialization switch means connected between said inverting input lead and said output lead of said operational amplifier, said second feedback initialization switch means being closed during a period of time when said first feedback initialization switch means is closed, said second feedback initialization switch means remaining closed for a period of time after said first feedback initialization switch means opens, said second feedback initialization switch means opening after said period of time;

a third switch means connected between said second plate of said feedback capacitor and said output lead of said operational amplifier; and a fourth switch means connected between said second plate of said feedback capacitor and said reference voltage, wherein said output lead of said operational amplifier of said first gain stage is connected to said input lead of said second gain stage.

2. The structure as in claim 1 wherein said input capacitor means comprises:

a plurality of N capacitors, each having a first plate connected in common to said inverting input lead of said operational amplifier, and a second plate;

a first plurality of N-1 switch means, each connected between said second plate of an associated one of N-1 of said N capacitors and said input lead;

a second plurality of N-1 switch means, each connected between said second plate of an associated one of N-1 of said N capacitors and said reference voltage.

3. The structure as in claim 2 wherein each said input capacitor means comprise an additional switch means connected between said second plate of said Nth capacitor and said input lead, and an additional switch means connected between said second plate of said Nth capacitor and said reference voltage.

4. A gain amplifier comprising at least a first and a second gain stage, wherein each said gain stage comprises:
   an input lead for receiving an input signal to be amplified;
   an operational amplifier having an inverting input lead, a noninverting input lead connected to a reference voltage, and an output lead;
   a feedback capacitor having a first plate connected to said inverting input lead and a second plate connected to said output lead of said operational amplifier;
   input capacitor means connected between said input lead and said inverting input lead of said operational amplifier;
   a first feedback initialization switch means connected between said inverting input lead and said output lead of said operational amplifier,
and wherein said second gain stage further comprises:
   a second feedback initialization switch means connected between said inverting input lead and said output lead of said operational amplifier;
   a third switch means connected between said second plate of said feedback capacitor and said output lead of said operational amplifier;
   a fourth switch means connected between said second plate of said feedback capacitor and said reference voltage, wherein said output lead of said operational amplifier of said first gain stage is connected to said input lead of said second gain stage;
and wherein:
   during a first time period, said reference voltage is applied to said input lead of said first gain stage, said first feedback initialization switch means are closed, said second feedback initialization switch means is closed, said third switch means is open and said fourth switch means is closed;
   during a second time period, said reference voltage is applied to said input lead of said first gain stage, said first feedback initialization switch means are open, said second feedback initialization switch means is closed, said third switch means is open, and said fourth switch means is closed; and
   during a third time period, a selected input voltage is applied to said input lead of said first gain stage, said first and said second feedback initialization switch means are open, said third switch means is closed, and said fourth switch means is open,
whereby the effects on the output voltage of the inherent offset voltages of said operational amplifiers and the error voltages created by the operation of said switch means are minimized.

5. The structure as in claim 4 wherein the capacitances of each said input capacitor means is selected during said first time period, and wherein the gain of each said gain stage is equal to the negative of the ratio of the capacitance of said input capacitance means to the capacitance of said feedback capacitor.

6. A method for amplifying an input signal using a gain amplifier comprising at least a first and a second gain stage, wherein each said gain stage comprises:
   an input lead for receiving an input signal to be amplified;
   an operational amplifier having an inverting input lead, a noninverting input lead connected to a reference voltage, and an output lead;
   a feedback capacitor having a first plate connected to said inverting input lead and having a second plate connected to said output lead of said operational amplifier;
   input capacitor means connected between said input lead and said inverting input lead of said operational amplifier;
   a first feedback initialization switch means connected between said inverting input lead and said outut lead of said operational amplifier,
and wherein said second gain stage further comprises:
   a second feedback initialization switch means connected between said inverting input lead and said output lead of said operational amplifier; and
   a third switch means connected between said second plate of said feedback capacitor and said output lead of said operational amplifier;
   a fourth switch means connected between said second plate of said feedback capacitor and said reference voltage, wherein said output lead of said operational amplifier of said first gain stage is connected to said input lead of said second gain stage, said method comprising the steps of:
   during a first time period, applying said reference voltage to said input lead of said first gain stage, closing said first feedback initialization switch means, closing said second feedback initialization switch means, opening said third switch means and closing said fourth switch means;
   during a second time period, applying said reference voltage to said input lead of said first gain stage, opening said first feedback initialization switch means; and
   during a third time period, applying a selected input voltage to said input lead of said first gain stage, opening said second feedback initialization switch means, closing said third switch means, and opening said fourth switch means,
whereby the effects on the output voltage of the inherent offset voltages of said operational amplifiers and the error voltages created by the operation of said switch means are minimized.

7. The method as in claim 6 wherein said input capacitor means comprises:
   a plurality of N capacitors, each having a first plate connected in common to said inverting input lead of said operational amplifier, and a second plate selectively connected to said input lead.

8. The method as in claim 7 wherein said first and second plurality of switch means are operated during said first time period to establish an effective capacitance of said input capacitor means and wherein the gain of each said gain stage is equal to the negative of the ratio of the capacitance of said input capacitance means to the capacitance of said feedback capacitor.

9. A gain amplifier comprising at least a first gain stage having a first gain factor and a second gain stage having a second gain factor, wherein each said gain stage comprises:

an input lead for receiving an input signal to the amplified;

an operational amplifier having an inverting input lead, a noninverting input lead connected to a reference voltage, and an output lead;

a feedback capacitor having a first plate connected to said inverting input lead and a second plate connected to said output lead of said operational amplifier;

input capacitor means connected between said input lead and said inverting input lead of said operational amplifier;

feedback initialization switch means connected between said inverting input lead and said output lead of said operational amplifier, and wherein in said second gain stage, said feedback initialization switch means closes during a period of time when the feedback initialization switch means of said first gain stage closes, said feedback initialization switch means of said second gain stage remaining closed for a period of time after the feedback initialization switch means of said first gain stage opens, the feedback initialization switch means of said second gain stage opening after said period of time, and wherein said second gain stage further comprises:

second switch means connected between said second plate of said feedback capacitor and said output lead of said operational amplifier; and third switch means connected between said second plate of said feedback capacitor and said reference voltage, wherein said output lead of said operational amplifier of said first gain stage is connected to said input lead of said second gain stage.

10. A method for amplifying an input signal using a gain amplifier comprising at least a first stage and a second stage, wherein each said stage comprises:

an input lead for receiving an input signal to be amplified;

an operational amplifier having an inverting input lead, a noninverting input lead connected to a reference voltage, and an output lead;

a feedback capacitor having a first plate connected to said inverting input lead and a second plate connected to said output lead of said operational amplifier;

input capacitor means connected between said input lead and said inverting input lead of said operational amplifier;

feedback initialization switch means connected between said inverting input lead and said output lead of said operational amplifier, and wherein said second gain stage further comprises:

second switch means connected between said second plate of said feedback capacitor and said output lead of said operational amplifier;

third switch means connected between said second plate of said feedback capacitor and said reference voltage, wherein said output lead of said operational amplfier of said first gain stage is connected to said input lead of said second gain stage, said method comprising the steps of:

during a first time period, applying said reference voltage to said input lead of said first gain stage, closing said feedback initialization switch means of said first and second gain stages, opening said second switch means, and closing said third switch means;

during a second time period, applying said reference voltage to said input lead of said first gain stage, and opening said feedback initialization switch means of said first gain stage but not said second gain stage; and during a third time period, applying a selected input voltage to said input lead of said first gain stage, opening said feedback initialization switch means of said second stage, closing said second switch means, and opening said third switch means, whereby the effects on the output voltage of the inherent offset voltages of said operational amplifiers and the error voltages created by the operation of said switch means are minimized.

* * * * *